(12) United States Patent
Takeuchi et al.

(10) Patent No.: US 6,269,032 B1
(45) Date of Patent: Jul. 31, 2001

(54) ELECTRONIC CONTROL UNIT HAVING VOLTAGE RESPONSIVE DATA WRITING

(75) Inventors: Yoshiharu Takeuchi; Takayoshi Honda, both of Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/717,315

(22) Filed: Nov. 22, 2000

(30) Foreign Application Priority Data

Dec. 3, 1999 (JP) .................................................. 11-344811

(51) Int. Cl.⁷ ....................................................... G11C 7/00
(52) U.S. Cl. ..................... 365/195; 365/228; 365/230.06; 365/189.09
(58) Field of Search .................................. 365/228, 229, 365/230.06, 189.09

(56) References Cited

U.S. PATENT DOCUMENTS 4,977,537 * 12/1990 Dias et al. ............................ 365/228
5,199,032   3/1993 Sparks et al. .

FOREIGN PATENT DOCUMENTS

| | | |
|---|---|---|
| 2 191 613 | 12/1987 | (GB) . |
| 58-125102 | 7/1983 | (JP) . |
| 59-211742 | 11/1984 | (JP) . |
| 01-267756 | 10/1989 | (JP) . |
| 02-308318 | 12/1990 | (JP) . |
| 03-252838 | 11/1991 | (JP) . |
| 05-233475 | 9/1993 | (JP) . |
| 07-114401 | 5/1995 | (JP) . |
| 11-143788 | 5/1999 | (JP) . |

* cited by examiner

*Primary Examiner*—Terrell W. Fears
(74) *Attorney, Agent, or Firm*—Nixon & Vanderhye P.C.

(57) ABSTRACT

An electronic control unit is provided with a microcomputer, a power supply circuit and a filter circuit. The microcomputer comprises a CPU, a ROM, a RAM and a SRAM. A voltage-drop detecting circuit within the power supply circuit receives a constant voltage generated in a constant voltage circuit and outputs a voltage detection signal WI by monitoring fall of such constant voltage. The filter circuit also receives the WI signal, generates a WI(A) signal and a WI(B) signal and outputs the WI(B) signal to the SRAM as the signal for restricting the data write operation. The CPU allows start of the data write operation to the SRAM and executes the write operation of data for each data that requires the concurrency when both WI(A) and WI(B) signals indicate permission of the data write operation.

15 Claims, 7 Drawing Sheets

ELECTRONIC CONTROL UNIT HAVING VOLTAGE RESPONSIVE DATA WRITING

CROSS REFERENCE TO RELATED APPLICATION

This application is based on and incorporates herein by reference Japanese Patent Application No. 11-344811 filed Dec. 3, 1999.

BACKGROUND OF THE INVENTION

1. Field of the Invention

The present invention relates to an electronic control unit (ECU) for controlling automobiles and/or automotive engines, and particularly to an improvement in a method of data writing to a stand-by random access memory (RAM), electrically-erasable programmable read-only memory (EEPROM) or the like to be provided in the relevant electronic control unit.

2. Related Art

GB2191613A (JP-A No. S62-258154) discloses a data backup apparatus. In this apparatus, if a constant voltage Vcc drops during a periodical writing process of data on the occasion of conducting the periodical writing of data, such a write process is instantaneously stopped and an interrupt process (routine) for saving the data is executed preferentially. Therefore, when the periodical write process is recovered after the end of interrupt process, it is thought that the SRAM write process is inhibited (restricted) in the course of such a write process. During this event, it is assumed that the data before and after the write process co-exist in the SRAM and erroneous write process is conducted.

For example, if the data before the write process and the data after the write process co-exist, the concurrency is lost in such a case as writing the data that requires concurrency such as combination of the timing for starting receiving an engine knock signal (gate opening time) and the timing for ending receiving the same (gate closing time).

Moreover, when there are many important data that must be saved for the data saving process accompanied by the most preferential interrupt process, a longer time is required for the data saving process. Accordingly, all data that requires the saving will not be written in the SRAM within the accessible time thereof.

In Japanese Unexamined Utility Model Publication No. S63-84800, when the constant voltage Vcc drop, the write operation of data in the course of writing to SRAM is continued and when writing of data is completed, such write operation is suspended. Therefore, also in the event that the data that requires concurrency is written, the concurrency of data is lost because the data writing is stopped in the course of the writing operation and the data after the end of data writing and the data before the start of data writing co-exist.

Thus, the vehicle or engine controllability is lessened when data is read from SRAM after recovery of the constant voltage for use in the control of engine or vehicle, if concurrency is lost for the data that requires the concurrency and the data is erroneously written.

SUMMARY OF THE INVENTION

It is an object of the present invention to provide an electronic control unit that can maintain the concurrency for writing of data that requires concurrency and simultaneously executes a write process of data to a memory.

According to the present invention, an electronic control unit comprises a power supply source, a CPU, a memory, a voltage detecting circuit and a signal output circuit.

In one aspect, the signal output circuit outputs to the memory a signal indicating an inhibition of data write operation after elapse of time from an input of a voltage-drop signal from the voltage detecting circuit. The time is determined to complete the write operation of data divided for each data having at least concurrency. The CPU permits a start of the write operation to the memory to execute the write operation of data for each data that requires concurrency when a signal output from the voltage-drop detecting circuit is other than the voltage-drop signal and a signal output from the signal output circuit indicates a permission of data write operation.

In another aspect, the signal output circuit generates a first signal that shifts to a data write inhibition condition from a data write permission condition after a predetermined time has passed from input of a voltage-drop signal from the voltage-drop detecting circuit and a second signal that shifts to the data write inhibition condition from the data write permission condition after elapse of time determined to complete the write operation of data divided for each data that requires at least concurrency after the shift of condition of the first signal. The signal output circuit further generates a second signal to the memory to restrict the data write operation. The CPU permits a start of the data write operation to the memory to execute the write operation of data for each data that requires the concurrency when both the first and second signals output from the signal output circuit indicate permission of the data write operation.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described with reference to various embodiments, which are directed to an electronic control unit (ECU) as a central unit for the control of automobiles and/or automotive engines.

(First Embodiment)

Figure 1:
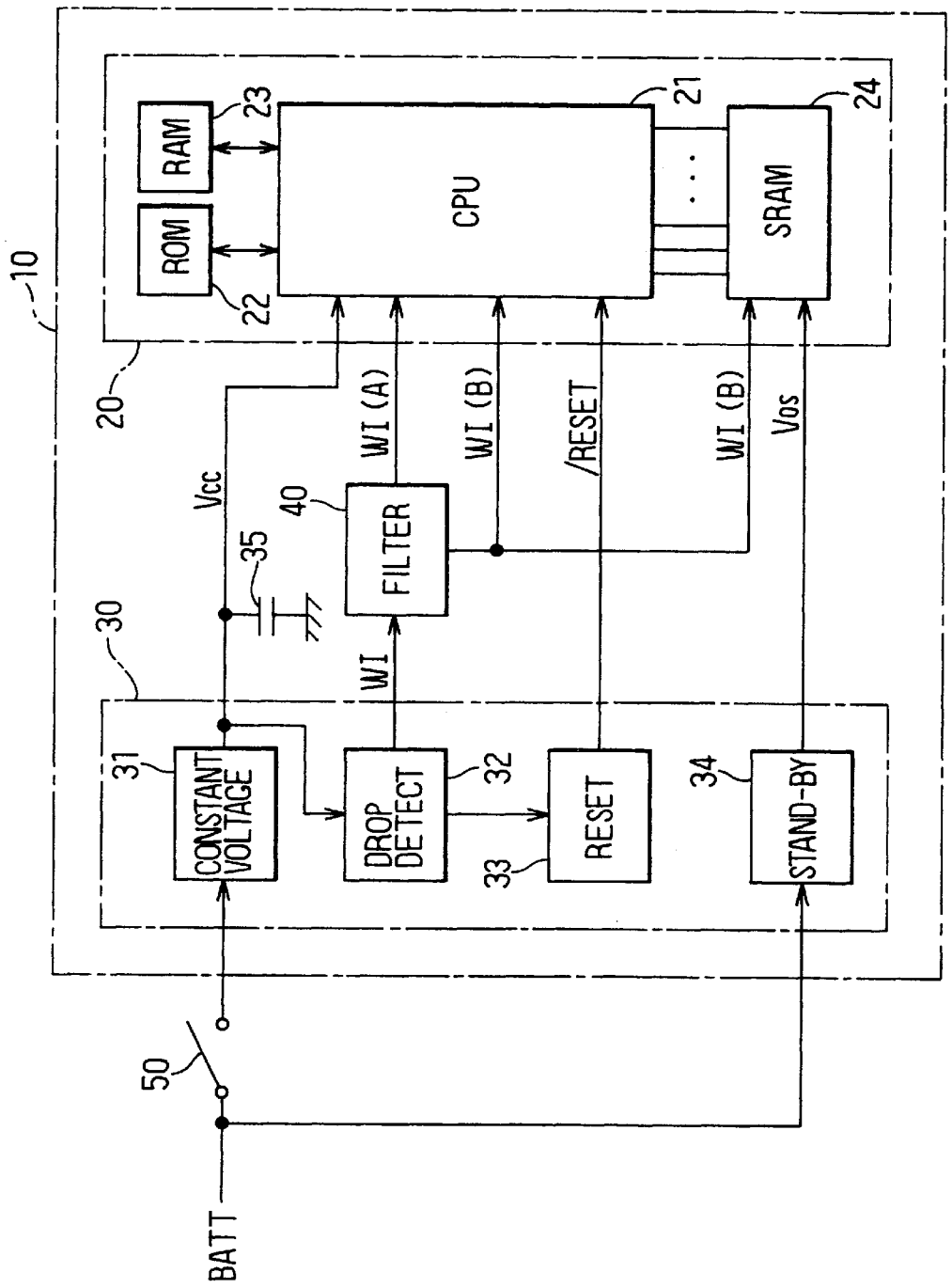
FIG. 1 is a block diagram illustrating an ECU used in a first embodiment of the present invention.

Referring first to FIG. 1, an engine ECU 10 is generally comprised of a microcomputer 20 for executing various engine controls such as fuel injection control and ignition timing control, a power supply IC 30 for receiving a battery voltage and a filter circuit 40 allocated between the microcomputer 20 and the power supply IC 30.

The microcomputer 20 comprises CPU 21, ROM 22, RAM 23 and SRAM 24. The CPU 21 executes a control program stored within the ROM 22 to temporarily store the control data or the like within the RAM 23. The SRAM 24 is always supplied with a voltage Vos in order to hold the contents stored therein.

Moreover, the power supply IC 30 comprises a constant voltage circuit 31, a voltage-drop detecting circuit 32, a reset circuit 33 and a stand-by power supply circuit 34. The constant voltage circuit 31 receives a battery voltage via an ignition switch (IGSW) 50 to generate a predetermined constant voltage Vcc (for example, 5V). A capacitor 35 provided as a capacitive load is connected between the constant voltage circuit 31 and microcomputer 20 and this capacitor 35 is used to eliminate noise level.

The voltage-drop detecting circuit 32 receives the constant voltage Vcc generated in the constant voltage circuit 31, compares it with a preset threshold value Vt1 (for example, 4.5V) and outputs a high (H) level or low (L) level voltage detection signal WI depending on the result of comparison. That is, the voltage-drop detecting circuit 32 sets WI to the H level (WI=H) when Vcc≧vth1 or to the L level (WI=L) when Vcc<Vth1.

The reset circuit 33 outputs a reset signal (/RESET) to the CPU 21 when the voltage-drop detecting circuit 32 detects that the constant voltage Vcc falls below a predetermined reset voltage Vth2 (for example, 3.5V). Moreover, the stand-by power supply circuit 34 is supplied with a battery voltage directly without by way of the ignition switch 50 to generate a voltage Vos and applies this voltage Vos to the SRAM 24.

The filter circuit 40 receives a voltage detection signal WI output from the voltage-drop detecting circuit 32 and then generates and outputs a couple of write permission signals WI(A), WI(B) based on such WI signal. Here, WI(A), WI(B)=H indicates a write permission condition, while WI(A), WI(B)=L indicates a write inhibition condition. When the WI signal changes to L from H or changes inversely to H from L, the WI(A) and WI(B) signals are respectively delayed for the predetermined filtering time that is set individually. The WI(A) signal is output only to the CPU 21, while the WI(B) signal is output to both CPU 21 and SRAM 24. Data write of SRAM 24 is limited with the WI(B) signal. When the signal WI(B)=L is output to the SRAM 24, the data write operation to the SRAM 24 with the relevant signal is inhibited.

Figure 2:
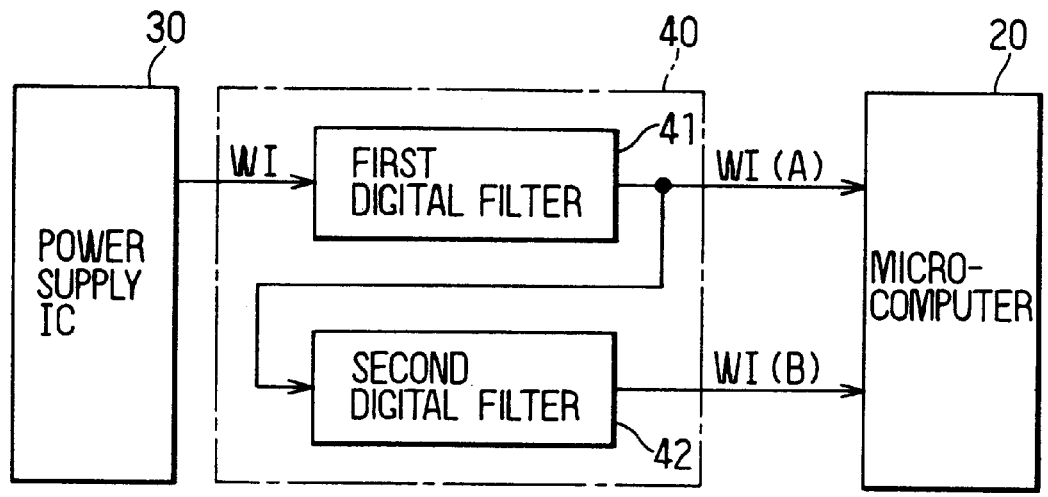
FIG. 2 is a block diagram illustrating an example of structure of a filter circuit used in the first embodiment.

As shown in FIG. 2, the filter circuit 40 comprises a first digital filter 41 for inputting the WI signal from the power supply IC 30 (power supply voltage drop detecting circuit 32) and outputting the WI(A) signal and a second digital filter 42 for inputting the WI(A) signal from the relevant first digital filter 41 and outputting the WI(B) signal. Here, the WI(A) signal is defined as a first signal, while the WI(B) signal is defined as a second signal.

The first digital filter 41 reads twice the input data in the predetermined sampling period and generates an output data. Therefore, if the sampling period is, for example, 1 μs, the WI(A) signal is delayed as much as the filtering time of 1 to 2 μs from the WI(A) signal. Since the WI(A) signal is generated mainly in order to eliminate noise on the WI signal, the filtering time (time for delaying the WI signal) of the first digital filter 41 is sufficient when it is as short as attaining the noise elimination purpose.

Moreover, the second digital filter 42 generates an output data by reading n-times the input data in the predetermined sampling period. The number of times of read operation shall be set freely, for example, 2, 4 and 8 times. Therefore, in the event that the sampling period is set to 1 μs and the relevant digital filter 42 reads four times, the WI(B) signal is delayed as much as the filtering time of 3 to 4 μs from the WI(A) signal.

Specifically, in this embodiment, the data having concurrency is divided into individual blocks and data is written to the SRAM 24 for each block. The data having concurrency means a combination, for example, of the timing to start the receiving or reading of knock signal of engine (gate open time) and the timing to complete the receiving thereof (gate close time) and each data of such timing must always be managed in a paired condition in order to keep the reliability of control.

Therefore, when data write operation to the SRAM 24 is started, the filtering time of the second digital filter 42 is set so that the data divided as explained above (the data having the concurrency) is surely written in unit of the block of the constant amount. This filtering time is set longer than the time required for data write in unit of block explained above.

Figure 3:
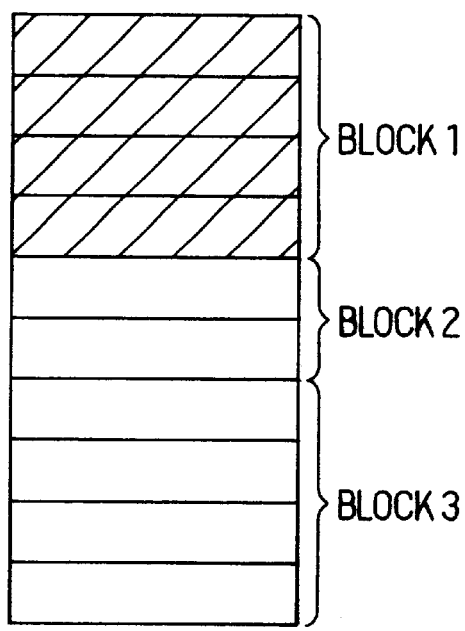
FIG. 3 is a diagram illustrating a format of data to be written to SRAM in the first embodiment.

An example of data write operation to the SRAM 24 is illustrated in FIG. 3. The write data has a format, for example, that is formed of a plurality of data of two bytes and is divided in every data that requires concurrency. In FIG. 3, the write data is divided into the block 1, block 2 and block 3 in unit that can be separated.

Figure 4:
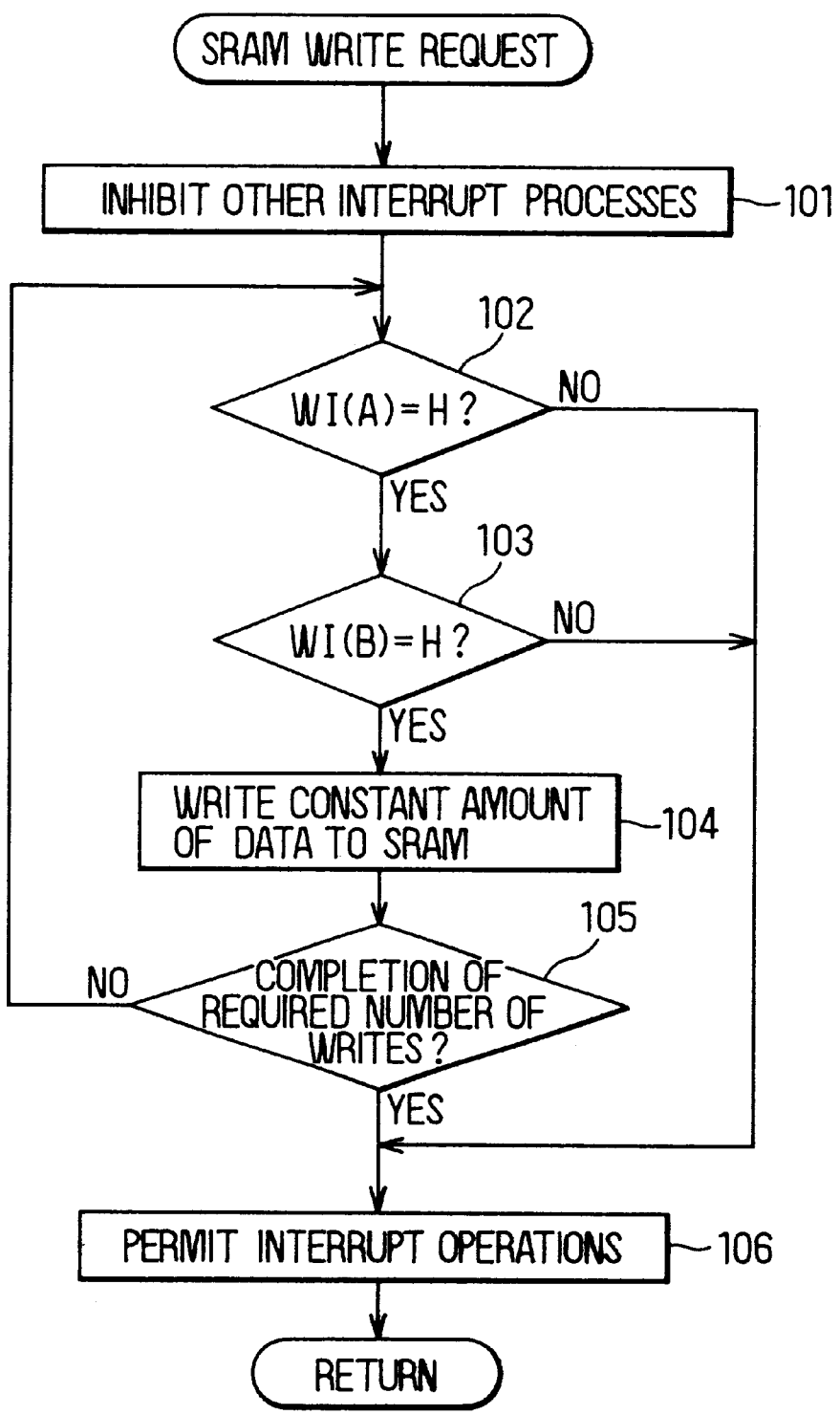
FIG. 4 is a flowchart illustrating a write process of data to SRAM in the first embodiment.

Next, operation of ECU 10 will then be explained. First, the data write process to the SRAM 24 by the CPU 21 will be explained with reference to the flowchart of FIG. 4. The process of FIG. 4 is started in response to the predetermined SRAM write request. Actually, the SRAM write request is called in the following time point: predetermined time period and/or before the main relay (not illustrated) is turned off when the IGSW is in the OFF state.

When the process of FIG. 4 is started, the other interrupt process is inhibited at step 101. Thereafter, at step 102, whether the WI(A) signal is at the H level or not is determined. At the subsequent step 103, whether the WI(B) signal is at the H level or not is determined. When any one of the WI(A) and WI(B) signals is at the L level, the current SRAM write operation is not executed and the process jumps to step 106. Here, after the other interrupt process is permitted and this process is completed.

When both WI(A) and WI(B) signals are at the H level, the process advances to step 104 and data is written to the SRAM 24 from the RAM 23 for every constant amount of data. That is, as explained in regard to FIG. 3, the data requiring the concurrency is divided into a plurality of blocks and the data is written to the SRAM 24 in unit of block. In this case, when WI(A)=H and WI(B)=B, the WI(B) signal becomes L level in the course of data write in unit of block and the SRAM write operation is never inhibited (restricted). Therefore, the data write to the SRAM 24 is not interrupted.

Thereafter, at step 105, whether the SRAM write operations for the required number of times are completed or not is determined. That is, when the write data is formed, for example, of the blocks 1 to 3, the number of times of write operations required is "3" and therefore whether the data write operation of three times has been completed or not is determined. When result is NO at step 105, the process returns to step 102 and the processes of steps 102 to 105 are repeated. Moreover, if the result is YES at step 105, the other interrupt process is permitted at step 106 and thereafter this process is completed.

Figure 5:
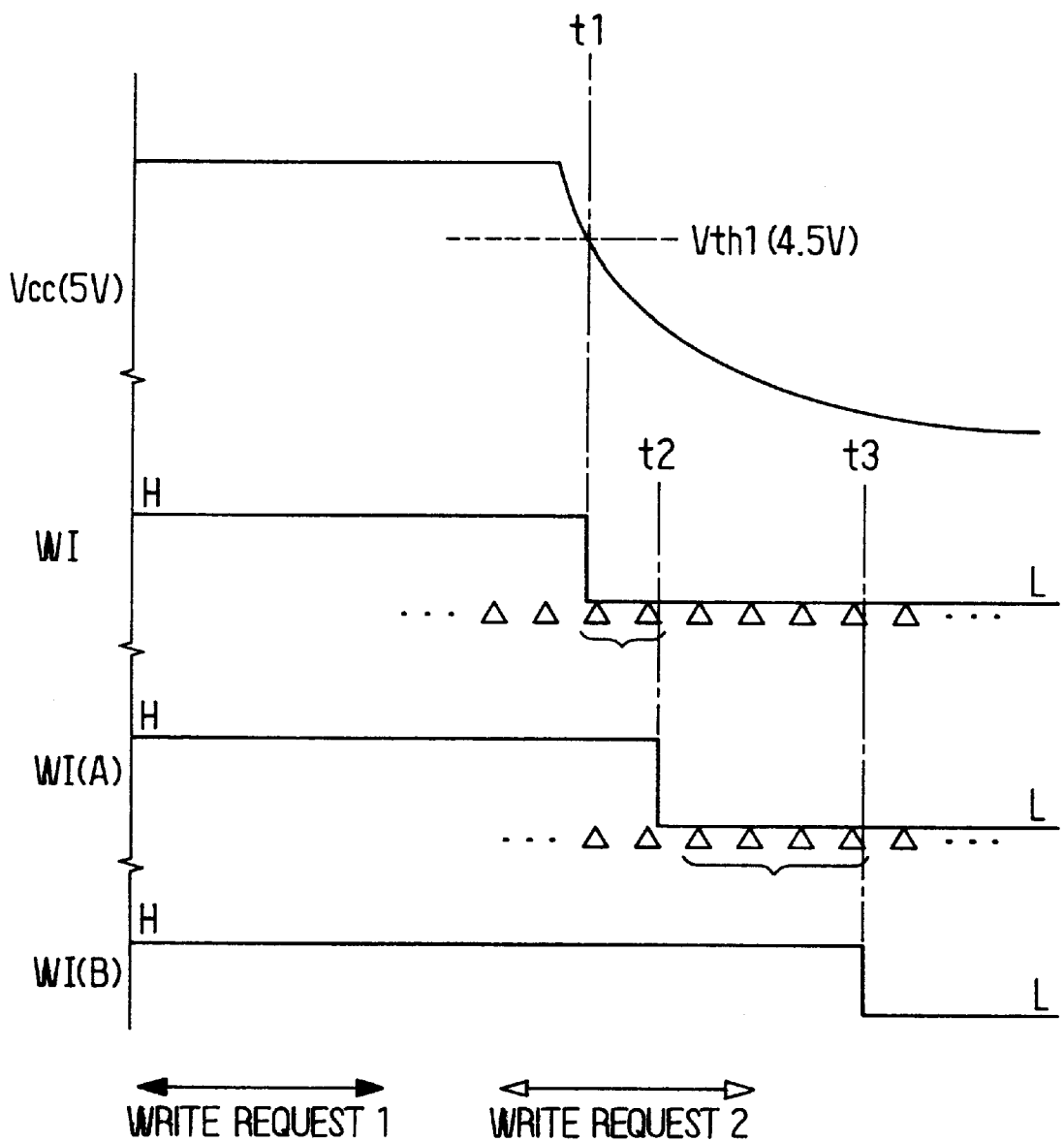
FIG. 5 is a time chart illustrating the write operation of SRAM in the first embodiment.

FIG. 5 is a time chart illustrating the SRAM write operation. In this figure, the periodical SRAM write operation process in a couple of time points of the "Write request 1" and "Write request 2" and this process will be explained in correspondence to the behaviors of the constant voltage Vcc. The mark Δ indicates the sampling time in the filter circuit 40 (for instance, 1 μs interval).

For example, in the event of SRAM write operation in response to the "Write request 1", since the constant voltage Vcc is higher than the threshold value Vth1 (WI=H), WI(A) and WI(B) signals are held at the H level to allow the data write to the SRAM 24. At the time of this "Write request 1", write operation of all data is completed.

Moreover, in the event of SRAM write operation in response to the "Write request 2", since the WI(A) and WI(B) signals are at the H level at the beginning of operation, start of write operation is permitted. Operations when the constant voltage Vcc drops in the course of the SRAM operation in response to the "Write request 2" will be explained below in detail.

That is, the constant voltage Vcc drops and Vcc becomes lower than threshold value vth1 (Vcc<Vth1) at time t1, the WI signal is inverted to the L level. Moreover, when the WI signal is read twice at time t2 after time t1, the WI(A) signal is inverted to the L level and thereafter the WI(B) signal is then inverted to the L level at time t3 wherein the WI(A) signals are read four times. Therefore, in the period from time t1 to time t2, both WI(A) and WI(B) signals are at the H level and start of the SRAM write operation is permitted. In this time point, write operation is performed for every constant amount of data divided with reference to the concurrency and this write operation is completed until the WI(B) signal becomes L level (WI(B)=L), that is, until the write operation to the SRAM 24 is inhibited. Therefore, the write operation of data requiring concurrency is never interrupted and matching of write data can be maintained. In addition, in the period from time t2 to time t3, since WI(A)=L, WI(B)=H, start of the SRAM write operation is not permitted.

Here, the capacitor 35 is connected to the constant voltage circuit 31. Therefore, if the constant voltage Vcc changes as illustrated in FIG. 5 when the power supply is cut off, such a change increases gradually. Since falling profile of this voltage Vcc changes depending on the capacitance of the capacitor 35, there is little difference in the ECU for controlling the same engine and the unit block (lump) of data that requires concurrency is individually set for each ECU device. For instance, the ECU for a heavy duty truck uses more microcomputers and drive mechanisms than the ECU for a compact car and also connects larger number of capacitors (capacitive loads) to the power supply. Thus, the falling profile of the power supply (Vcc) is different in the ECU for a heavy duty truck and ECU for a compact car. However, there is no such a difference of voltage falling profile in the ECUs for a heavy duty truck or a compact car.

Moreover, comparatively complicated controls are often required in a heavy duty truck and a larger amount of data is written to the SRAM in comparison with the compact car. However, a larger number of capacitors are connected to the power supply in the heavy duty truck in comparison with the compact car and thereby the power supply voltage (Vcc) falls gradually and thereby more sufficient write operation time can be assured for the SRAM. Therefore, a unit block (lump) of data that requires concurrency can be enlarged and a larger amount of data can be written to the SRAM 24 in the case of the heavy duty truck.

Figure 6:
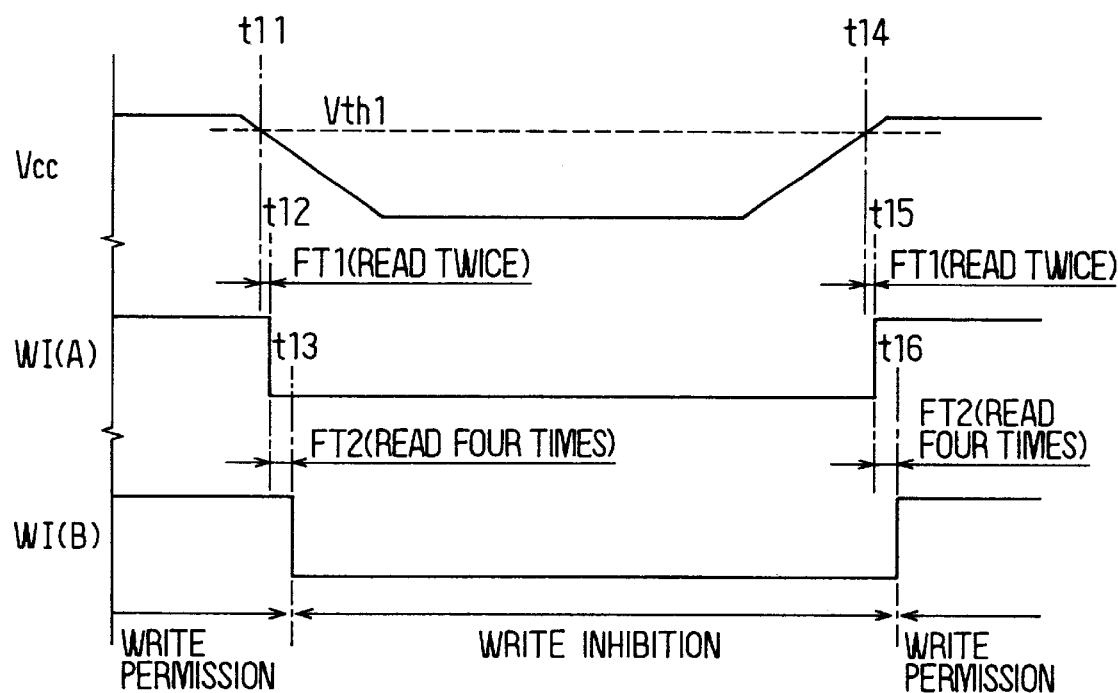
FIG. 6 is a time chart illustrating the write operation of data to SRAM in the first embodiment.

FIG. 6 is a time chart illustrating the profile wherein the constant voltage Vcc once drops and is thereafter recovered. The sections for write permission/inhibition to the SRAM 24 will be explained with reference to this figure.

In FIG. 6, fall of the constant voltage Vcc is detected at time t11 and the WI(A) signal falls to the L level at time t12 after the filtering time FT1 of the first digital filter 41 for reading twice the WI signal (H→L) at that time. Moreover, the WI(B) signal falls to the L level at time t13 after the filtering time FT2 of the second digital filter 42 for reading four times the WI(A) signal.

On the other hand, when the constant voltage vcc is recovered, rise of the constant voltage Vcc is detected at time t14 and the WI(A) signal is reset to the H level at time t15 after filtering time FT1 of the first digital filter 41 for reading twice the WI signal (L→H) at that time. Moreover, the WI(B) signal is reset to the H level at time t16 after the filtering time FT2 of the second digital filter 42 for reading four times the WI(A) signal.

In FIG. 6, the period before time t13 and the period after time t16 correspond to the SRAM write permission period and the period from time t13 to time t16 corresponds to the SRAM write inhibition period.

For instance, when the ignition switch 50 is OFF (IG-OFF period), the RAM data is transferred to the SRAM 42 until the main relay is turned off, but in some cases, the ignition witch 50 is turned on immediately after the IG-OFF state and a starter is then driven. In this case, it is also assumed that a battery voltage is temporarily reduced rapidly with the drive of starter. Since a series of the SRAM write operation is executed as explained above even when the battery voltage is reduced, the write operation of data that requires the concurrency is never interrupted.

According to the first embodiment, following effects can be attained.

(1) The filter circuit 40 is supplied with the WI signal and generates the WI(A) signal and WI(B) signal. The filter circuit 40 outputs the WI(B) signal to the SRAM 24 and the CPU 21 allows the start of the write operation to the SRAM 24 when the WI(A) and WI(B) signals indicate permission of write operation. In this case, it does not occur that data is erroneously written to the SRAM 24 or write operation is interrupted in the course of the write operation for the data that requires concurrency. The predetermined write operation to the SRAM 24 can be realized.

(2) When write operation of data of one block is completed at the time of SRAM write operation, whether write operation of next block can be started or not is determined and thereafter the relevant write operation can be started. Therefore, even when the data of a plurality of blocks is written, a series of write operations can be executed without fail. Moreover, even if the power supply voltage (Vcc) is reduced during a series of write operations responding to the data write request, the write operation is interrupted in the unit with reference to the concurrency of data. Accordingly, it does not occur that concurrency of data is not satisfied because of the interrupt of data write operation.

(3) Since the unit block of data that requires the concurrency is determined depending on the capacitance of the capacity 35 connected to the power supply (constant voltage circuit 31), the unit block of the data that requires the concurrency can be enlarged in a heavy duty truck or a higher class automobile wherein many microcomputers and capacitors are used.

(4) Since the filter circuit 40 is structured with the first digital filter 41 and second digital filter 42 having different filter time constants, two signals WI(A), WI(B) having different timings can be generated easily.

(5) Since the CPU 21 is supplied with the WI(A) and WI(B) via the filter circuit 40 in place of direct input of the WI signal from the voltage-drop detecting circuit 32, if the WI signal is influenced with noise, such noise can be eliminated. Accordingly, the SRAM write operation having more excellent reliability can be realized without any influence of noise.

(Second Embodiment)

The SRAM write operation is differentiated in a second embodiment from the first embodiment, in which the SRAM write operation is permitted at the time point where the WI(B) signal is reset to the H level when the constant voltage Vcc is recovered as shown in FIG. 6.

Figure 7:
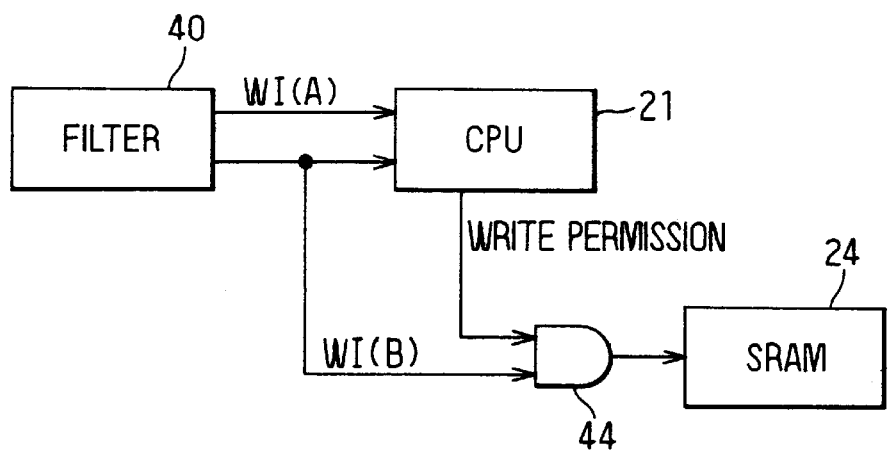
FIG. 7 is a block diagram illustrating a part of an ECU used in a second embodiment of the present invention.

In the second embodiment, as shown in FIG. 7, an AND circuit 44 is provided and this AND circuit 44 is input with the WI(B) signal output from the filter circuit 40 and a write permission flag output from the CPU 21. The SRAM 24 receives an output of the AND circuit 44 and this output restricts the write operation of data to the SRAM 24. That is, when both the WI(B) signal and write permission flag are at the H level, the SRAM write operation is allowed. However, when at least one signal is at the L level, the SRAM write operation is inhibited.

Here, the write permission flag is set to the L level when the constant voltage Vcc is lower than the reset voltage Vth2 and is also set to the H level with the initialization process triggered when the CPU 21 is reset.

Figure 8:
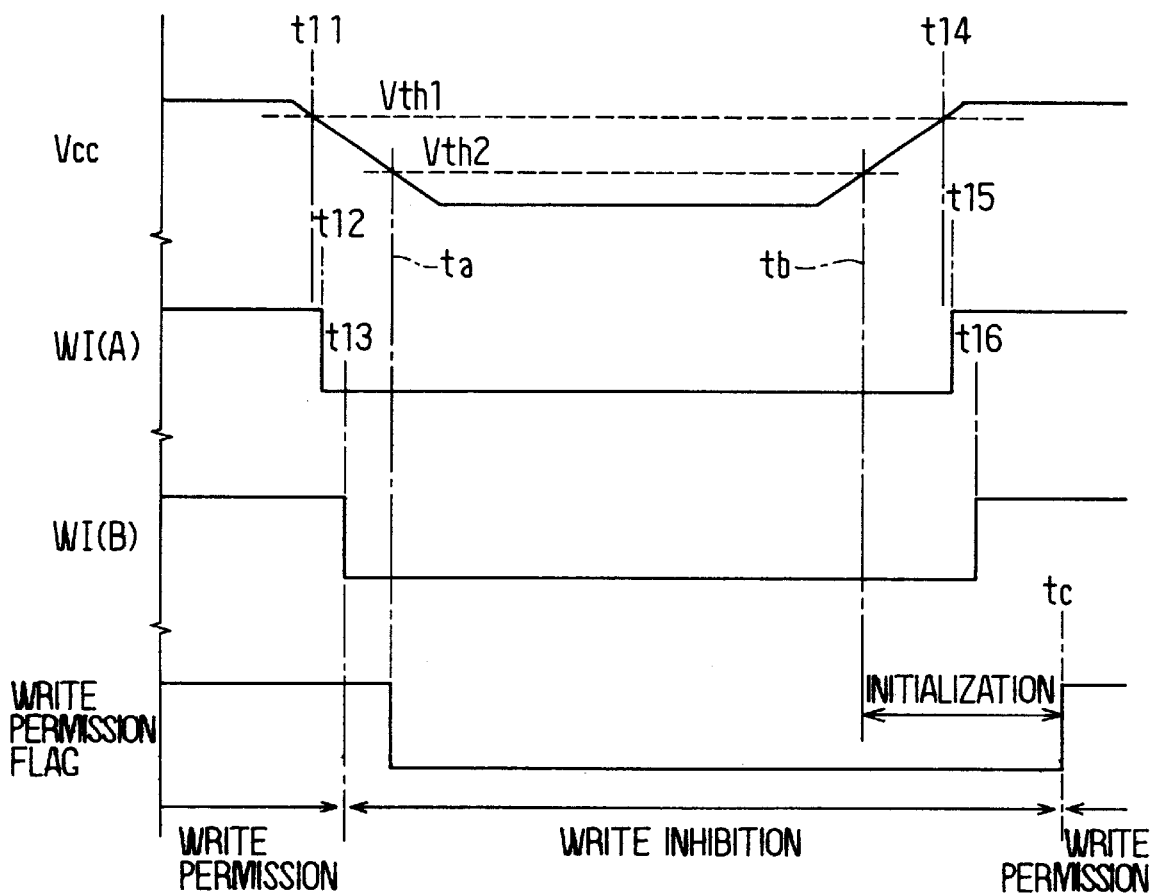
FIG. 8 is a time chart illustrating a write operation of data to SRAM in the second embodiment.

Operations of this embodiment will be explained with reference to a time chart of FIG. 8. In FIG. 8, since the behaviors of the Vcc, WI(A) and WI(B) signals are the same as in the first embodiment. When the constant voltage Vcc (power supply voltage) falls and becomes lower than the reset voltage Vth2 at time ta, the write permission flag is set to the L level. For instance, since WI(B)=L at time t13 before time ta, the SRAM write operation is inhibited at this time point (output of AND circuit 44=L). Thereafter, when the constant voltage Vcc is recovered, the CPU 21 is reset to start the initialization process at the time point tb where the constant voltage Vcc is higher than the reset voltage Vth2 (vcc>Vth2). With advancement of the initialization process, the write permission flag is reset to the H level at time tc (output of the AND circuit 44=H). Thereafter, the SRAM write operation can be restarted.

That is, in the second embodiment, the period before time t13 and the period after time tc correspond to the SRAM write permission period, while the period from time t13 to time tc corresponds to the SRAM write operation inhibition period. According to this embodiment, after the CPU 21 is reset, the SRAM write operation can be restarted.

(Third Embodiment)

Figure 9:
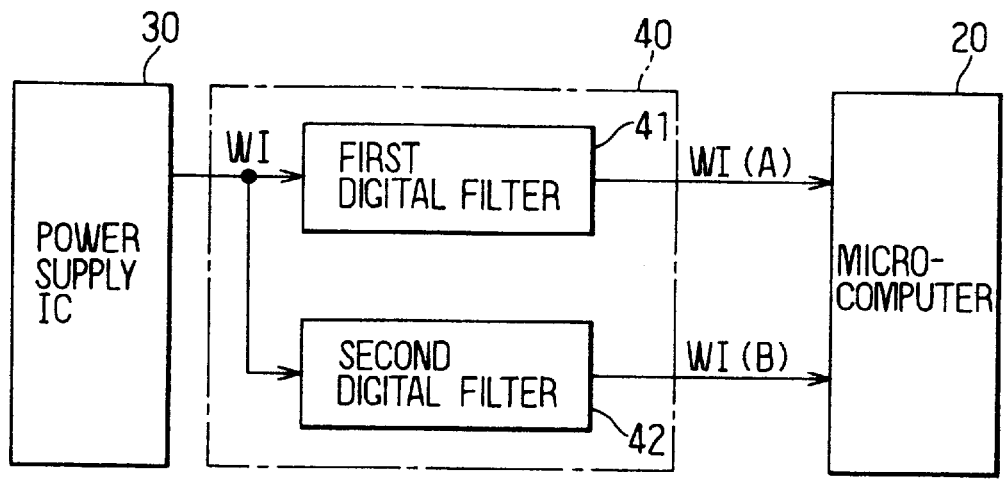
FIG. 9 is a block diagram illustrating a filter circuit used in a third embodiment of the present invention.

In a third embodiment, the filter circuit 40 of the first embodiment (FIG. 2) is modified as illustrated in FIG. 9. That is, the WI signal output from the power supply IC 30 is input to both first and second digital filters 41 and 42. Here, the first digital filter 41 reads the data twice. Moreover, the second digital filter 42 can be set freely to read the data four times or eight times under the condition that the second digital filter 42 has the filtering time longer than that of the first digital filter 41. For instance, it is also possible that the first and second digital filters 41 are 42 are constructed as analog filters.

(Fourth Embodiment)

Figure 10:
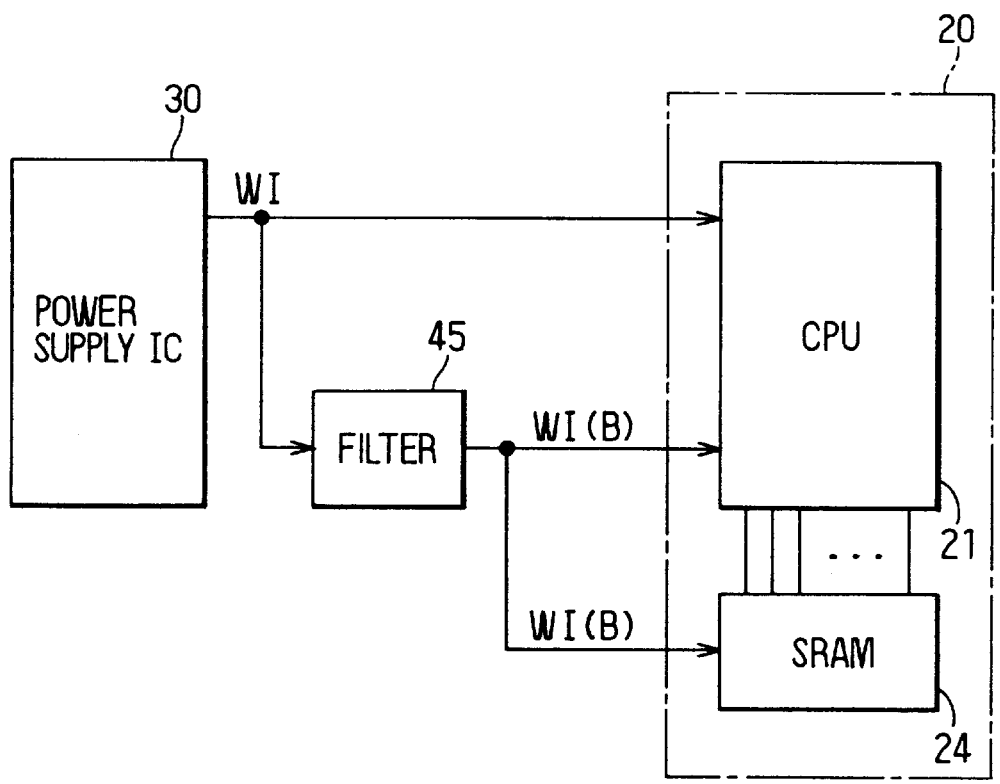
FIG. 10 is a block diagram illustrating an ECU used in a fourth embodiment of the present invention.

In a fourth embodiment, as illustrated in FIG. 10, the WI signal output from the power supply IC 30 is output to the CPU 21 directly and is also output to a filter circuit 45. As the filter circuit 45, the second digital filter 42, for example, illustrated in FIG. 2 may be used and the WI(B) signal as the output of such filter circuit is output to the CPU 21 and SRAM 24. After input of the WI signal of L level, the filter circuit 45 outputs the signal indicative of the write inhibition condition to the SRAM 24 after time to complete the write operation of data divided at least with reference to concurrency.

The ECU determines whether the WI signal and WI(B) signal are at the H level or not in the process executed in response to the "SRAM write request" explained in regard to FIG. 4 and starts the write operation to the SRAM 24 when the conditions are satisfied. In practice, the process of step 102 of FIG. 4 is changed to the determination process of "WI=H?"

Even in the fourth embodiment, it will not occur that data is erroneously written in the SRAM 24 or write operation of the data that requires the concurrency is interrupted in the course of the operation, and the predetermined write operation to the SRAM 24 can be realized. Moreover, only one digital filter is necessitated and thereby the filter circuit can be simplified.

In addition, in the fourth embodiment, it is also possible to provide an AND circuit as explained in regard to FIG. 7 in order to instruct the restart of the write operation to the SRAM 24 depending on the write permission flag produced from CPU 21.

For example, although the second digital filter 42 illustrated in FIG. 2 specifies the filtering time FT2 by setting the read operations of two times, four times or eight times, it specifies, in this embodiment, the filtering time with the time required for the write operations of four times as an example. The filtering time can be set variably depending on the contents of data to be written to the SRAM 24. That is, the filtering time of the second digital filter 42 can be changed adequately depending on the amount of data divided with reference to the concurrency. In this case, the write operation to SRAM 24 can be optimized.

In each embodiment, although the SRAM is used as a memory, the SRAM may be replaced with a non-volatile memory that can electrically erase or program the contents such as EEPROM and flash memory or the like. Any type of memory that is restricted in the data write operation when the power supply voltage falls can be used.

What is claimed is:

1. An electronic control unit comprising:
   a power supply source for supplying a power supply voltage;
   a memory for storing data;
   a voltage detecting circuit for outputting a voltage-drop signal indicating fall of the power supply voltage;
   a CPU for controlling a write operation of data to the memory based on the power supply voltage; and
   a signal output circuit for outputting, to the memory, a signal indicating an inhibition of data write operation after elapse of time from an input of the voltage-drop signal from the voltage detecting circuit, the time being determined to complete the write operation of data divided for each data having at least concurrency,
   wherein the CPU permits a start of the write operation to the memory to execute the write operation of data for each data that requires concurrency when a signal output from the voltage-drop detecting circuit is other than the voltage-drop signal and a signal output from the signal output circuit indicates a permission of data write operation.

2. An electronic control unit as in claim 1, wherein:
   the CPU determines, on an occasion of writing data to the memory in response to a write request, whether data write of a next block of the data can be started when the data write operation of one block of the data is completed, and thereafter starts the data write operation of the next block.

3. An electronic control unit as in claim 1, further comprising:

a capacitive load connected to a power supply source, wherein each block of the data that requires concurrency is determined depending on a capacitance of the capacitive load.

4. An electronic control unit as in claim 1, wherein:

the CPU permits the data write operation to the memory by by executing an initialization process following a resetting operation thereof, after inhibiting the data write operation to the memory.

5. An electronic control unit as in claim 1, wherein:

the memory includes at least one of a stand-by RAM that holds stored data with a power supply from the power source and a non-volatile memory that is capable of electrically erasing and writing data.

6. An electronic control unit as in claim 1, wherein:

the data requiring the concurrency includes a data for starting a predetermined processing and a data for ending the predetermined processing.

7. An electronic control unit as in claim 1, wherein:

the data requiring the concurrency includes at least two data which define one processing.

8. An electronic control unit comprising:

a power supply source for providing a power supply voltage;

a memory for storing data;

a voltage detecting circuit for outputting a voltage-drop signal indicating fall of the power supply voltage;

a CPU for controlling a write operation of data to the memory based on the power supply voltage; and a signal output circuit for generating a first signal that shifts to a data write inhibition condition from a data write permission condition after a predetermined time has passed from input of the voltage-drop signal from the voltage-drop detecting circuit and a second signal that shifts to the data write inhibition condition from the data write permission condition after elapse of time determined to complete the write operation of data divided for each data that requires at least concurrency after the shift of condition of the first signal, the second signal being output to the memory to restrict the data write operation, wherein the CPU permits a start of the data write operation to the memory to execute the write operation of data for each data that requires the concurrency when both the first and second signals output from the signal output circuit indicate permission of the data write operation.

9. An electronic control unit as in claim 8, wherein:

the CPU determines, on an occasion of writing data to the memory in response to a write request, whether data write of a next block of the data can be started when the data write operation of one block of the data is completed, and thereafter starts the data write operation of the next block.

10. An electronic control unit as in claim 9, wherein:

the signal output circuit includes a first filter circuit and a second filter circuit having different filter constants and outputting the first signal and the second signal, respectively.

11. An electronic control unit as in claim 8, further comprising:

a capacitive load connected to a power supply source, wherein each block of the data that requires concurrency is determined depending on a capacitance of the capacitive load.

12. An electronic control unit as in claim 8, wherein:

the CPU permits the data write operation to the memory by by executing an initialization process following a resetting operation thereof, after inhibiting the data write operation to the memory.

13. An electronic control unit as in claim 8, wherein:

the memory includes at least one of a stand-by RAM that holds stored data with a power supply from the power source and a non-volatile memory that is capable of electrically erasing and writing data.

14. An electronic control unit as in claim 8, wherein:

the data requiring the concurrency includes a data for starting a predetermined processing and a data for ending the predetermined processing.

15. An electronic control unit as in claim 8, wherein:

the data requiring the concurrency includes at least two data which define one processing.

* * * * *